(12) United States Patent
Takahashi et al.

(10) Patent No.: US 11,499,099 B2
(45) Date of Patent: Nov. 15, 2022

(54) ETCHING COMPOSITION

(71) Applicant: Fujifilm Electronic Materials U.S.A., Inc., N. Kingstown, RI (US)

(72) Inventors: Kazutaka Takahashi, Gilbert, AZ (US); Tomonori Takahashi, Shizuoka (JP); William A. Wojtczak, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 17/009,857

(22) Filed: Sep. 2, 2020

(65) Prior Publication Data

US 2021/0071078 A1    Mar. 11, 2021

Related U.S. Application Data

(60) Provisional application No. 62/898,069, filed on Sep. 10, 2019.

(51) Int. Cl.
| | |
|---|---|
| *C09K 13/06* | (2006.01) |
| *H01L 21/3213* | (2006.01) |
| *C09K 15/30* | (2006.01) |
| *C09K 13/00* | (2006.01) |

(52) U.S. Cl.
CPC .............. *C09K 13/06* (2013.01); *C09K 13/00* (2013.01); *C09K 15/30* (2013.01); *H01L 21/32134* (2013.01)

(58) Field of Classification Search
CPC ........ C09K 13/00; C09K 13/06; C09K 15/30; H01L 21/32134; C23F 1/10
USPC ..... 252/79.1, 79.2, 79.3, 79.4; 438/745, 754
See application file for complete search history.

(56) References Cited

U.S. PATENT DOCUMENTS

| | | | |
|---|---|---|---|
| 10,490,417 B2 | 11/2019 | Dory et al. | |
| 10,920,141 B2 * | 2/2021 | Chen | ................ H01L 21/02052 |
| 2008/0026583 A1 | 1/2008 | Hardy et al. | |
| 2009/0215658 A1 | 8/2009 | Minsek et al. | |
| 2009/0301996 A1 | 12/2009 | Visintin et al. | |
| 2010/0065530 A1 | 3/2010 | Walker et al. | |
| 2011/0318928 A1 | 12/2011 | Bian | |
| 2013/0200039 A1 | 8/2013 | Noller et al. | |
| 2014/0120734 A1 | 5/2014 | Takahashi et al. | |
| 2014/0134778 A1 * | 5/2014 | Ferstl | ................ H01L 31/02363 252/79.4 |
| 2015/0104952 A1 * | 4/2015 | Cui | ........................... C23F 1/18 438/745 |
| 2015/0118860 A1 * | 4/2015 | Muro | ................ H01L 21/02063 438/754 |
| 2015/0267112 A1 | 9/2015 | Dory et al. | |
| 2016/0152930 A1 * | 6/2016 | Egbe | .................... C11D 7/5013 510/176 |
| 2016/0200975 A1 | 7/2016 | Cooper et al. | |
| 2020/0020545 A1 | 1/2020 | Dory et al. | |

FOREIGN PATENT DOCUMENTS

| | | | | |
|---|---|---|---|---|
| JP | 202045685 A | * | 12/2020 | ............. C09K 13/00 |
| WO | WO 2007/044446 | | 4/2007 | |
| WO | WO 2015/054460 | | 4/2015 | |
| WO | WO 2020/146748 | | 7/2020 | |

OTHER PUBLICATIONS

International Search Report and Written Opinion of the International Searching Authority for International Application No. PCT/US20/49010, dated Nov. 27, 2020.
Hussai Muhammad Mustafa et al., "Metal Wet Etch Issues ad Effects in Dual Metal Gate Stack Integration", Journal of the Electrochemical Society, vol. 153(5):G389-G393, Jan. 1, 2006.
Extended European Search Report, issued in corresponding EP Appl. No. EP 20863776.9, dated Sep. 12, 2022, 14 pages.

* cited by examiner

*Primary Examiner* — Lan Vinh

(74) *Attorney, Agent, or Firm* — Fish & Richardson P.C.

(57) ABSTRACT

This disclosure relates to etching compositions containing 1) at least one oxidizing agent; 2) at least one chelating agent; 3) at least one organic solvent; 4) at least one amine compound; and 5) water.

27 Claims, No Drawings

ETCHING COMPOSITION

CROSS-REFERENCE TO RELATED APPLICATION

The present application claims priority to U.S. Provisional Application Ser. No. 62/898,069, filed on Sep. 10, 2019, the contents of which are hereby incorporated by reference in their entirety.

TECHNICAL FIELD

The present disclosure relates to compositions and processes to selectively etch titanium silicon nitride in the presence of other materials, such as metal conductors, barrier materials, insulator materials, and exposed or underlying layers of copper, tungsten, and low-k dielectric materials.

BACKGROUND

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Titanium silicon nitride (TiSiN) can be utilized for semiconductor devices and as ground layers and cap layers for precious metal, aluminum (Al) and copper (Cu) wiring. In semiconductor devices, it may be used as a barrier metal, a hard mask, or a gate metal.

In the construction of devices for these applications, TiSiN frequently needs to be etched. In the various types of uses and device environments of TiSiN, other layers are in contact with or otherwise exposed at the same time as the TiSiN is etched. Highly selective etching of the TiSiN in the presence of these other materials (e.g. metal conductors, dielectrics, and hard marks) is mandatory for device yield and long life. The etching process for the TiSiN may be a plasma etching process. However, using a plasma etching process on the TiSiN layer may cause damage to either or both the gate insulating layer and the semiconductor substrate. In addition, the etching process may remove a portion of the semiconductor substrate by etching the gate insulating layer exposed by the gate electrode. The electrical characteristics of the transistor may be negatively impacted. To avoid such etching damage, additional protective device manufacturing steps may be employed, but at significant cost.

Wet etching methods for TiSiN are known. Such methods may include use of etchants containing hydrofluoric acid in combination with other reagents. However, the selectivity with silicon based dielectrics and metals (e.g., Al) is not sufficient and other exposed metals in the device may also undergo corrosion or etching.

Thus, there is a need for TiSiN etching solutions that have relatively high etch rates, but have relatively low etch and corrosion rates for other semiconductor materials which are exposed or in contact with the TiSiN during the etching process.

SUMMARY

The present disclosure relates to compositions and processes for selectively etching TiSiN relative to metal conductor layers, hard mask layers and low-k dielectric layers that are present in the semiconductor device. More specifically, the present disclosure relates to a composition and process for selectively etching titanium silicon nitride relative to copper, tungsten, bottom anti-reflectant coating (BARC), high-k dielectric (e.g., HfOx), and interlayer dielectrics (ILD) (e.g., SiOx or low-k dielectrics).

In one aspect, the disclosure features an etching composition (e.g., an etching composition for selectively removing TiSiN) that includes: 1) at least one oxidizing agent; 2) at least one chelating agent; 3) at least one organic solvent; 4) at least one amine compound; and 5) water; in which the composition has a pH from about 6.5 to about 9.5.

In some embodiments, the etching compositions can include:

1) at least one oxidizing agent in an amount of from about 0.1% to about 30% by weight of the composition;

2) at least one chelating agent in an amount of from about 0.01% to about 1% by weight of the composition;

3) at least one organic solvent in an amount of from about 1% to about 30% by weight of the composition;

4) at least one amine compound comprising a diamine, an alkanolamine, or a quaternary ammonium compound, the at least one amine compound containing 1 to 6 carbon atoms and being in an amount of from about 0.1% to about 5% by weight of the composition; and 5) water;

in which the composition has a pH from about 6.5 to about 9.5.

In another aspect, the disclosure features a method that includes contacting a semiconductor substrate containing TiSiN features with an etching composition disclosed herein to remove the TiSiN features.

In still another aspect, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the etching composition. Unless otherwise noted, ambient temperature is defined to be between about 16 and about 27 degrees Celsius (° C.). As defined herein, a "water-soluble" substance (e.g., a water-soluble alcohol, ketone, ester, or ether) refers to a substance having a solubility of at least 0.5% by weight (e.g., at least 1% by weight or at least 5% by weight) in water at 25° C.

In one aspect, the disclosure features an etching composition (e.g., an etching composition for selectively removing TiSiN) that includes: 1) at least one oxidizing agent; 2) at least one chelating agent; 3) at least one organic solvent; 4) at least one amine compound; and 5) water.

In some embodiments, the etching compositions of this disclosure can contain at least one (e.g., two, three, or four) oxidizing agent suitable for use in microelectronic cleaning compositions. Examples of the oxidizing agent to be used in the compositions of this disclosure include, but are not limited to, peroxides (e.g., hydrogen peroxide, dialkylperoxides, urea hydrogen peroxide), persulfonic acids (e.g., hexafluoropropanepersulfonic acid, methanepersulfonic acid, trifluoromethanepersulfonic acid, or p-toluenepersulfonic acid) and salts thereof, ozone, percarbonic acids (e.g., peracetic acid) and salts thereof, perphosphoric acid and salts thereof, persulfuric acid and salts thereof (e.g., ammonium persulfate or tetramethylammonium persulfate), perchloric acid and salts thereof (e.g., ammonium perchlorate or tetramethylammonium perchlorate), and periodic acid and salts thereof (e.g., ammonium periodate or tetramethylammonium periodate). These oxidizing agents can be used singly or in combination.

In some embodiments, the at least one oxidizing agent is in an amount of at least about 0.1% by weight (e.g., at least about 1% by weight, at least about 2.5% by weight, at least about 5% by weight, at least about 7.5% by weight, at least about 10% by weight, at least about 11% by weight, at least about 12% by weight, at least about 13% by weight, at least about 14% by weight, or at least about 15% by weight) and/or at most about 30% by weight (e.g., at most about 25% by weight, at most about 20% by weight, at most about 19% by weight, at most about 18% by weight, at most about 17% by weight, or at most about 15% by weight) of the etching compositions of this disclosure.

In some embodiments, the etching compositions of this disclosure can contain at least one (e.g., two, three, or four) chelating agent, which can be, but is not limited to, a polyaminopolycarboxylic acid. For the purposes of this disclosure, a polyaminopolycarboxylic acid refers to a compound with a plurality of (e.g., two, three, four, or more) amino groups and a plurality of (e.g., two, three, four, or more) carboxylic acid groups. Suitable classes of polyaminopolycarboxylic acid chelating agents include, but are not limited to, mono- or polyalkylene polyamine polycarboxylic acids, polyaminoalkane polycarboxyalic acids, polyaminoalkanol polycarboxylic acids, and hydroxyalkylether polyamine polycarboxylic acids.

Suitable polyaminopolycarboxylic acid chelating agents include, but are not limited to, butylenediaminetetraacetic acid, diethylenetriaminepentaacetic acid (DTPA), ethylenediaminetetrapropionic acid, triethylenetetraminehexaacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexane tetraacetic acid, ethylendiamine diacetic acid, ethylendiamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, 1,4,7,10-tetraazacyclododecane-tetraacetic acid, diaminopropanol tetraacetic acid, and (hydroxyethyl)ethylenediaminetriacetic acid.

In some embodiments, the at least one chelating agent can be in an amount of at least about 0.01% by weight (e.g., at least about 0.05% by weight, at least about 0.1% by weight, at least about 0.15% by weight, at least about 0.2% by weight, at least about 0.25% by weight, or at least about 0.3% by weight) and/or at most about 1% by weight (e.g., at most about 0.9% by weight, at most about 0.8% by weight, at most about 0.7% by weight, at most about 0.6% by weight, at most about 0.5% by weight, at most about 0.4% by weight, or at most about 0.3% by weight) of the etching compositions of this disclosure.

In some embodiments, the etching compositions of this disclosure can optionally contain at least one (e.g., two, three, or four) metal corrosion inhibitor selected from substituted or unsubstituted benzotriazoles. Suitable substituted benzotriazoles include, but are not limited to, benzotriazoles substituted with alkyl groups, aryl groups, halogen groups, amino groups, nitro groups, alkoxy groups, and hydroxyl groups. Substituted benzotriazoles also include those fused with one or more aryl (e.g., phenyl) or heteroaryl groups.

Suitable benzotriazoles for use as a metal corrosion inhibitor include, but are not limited to, benzotriazole (BTA), 5-am inobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole (5-MBTA), benzotriazole-5-carboxylic acid, 4-m ethylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-dimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

In some embodiments, the at least one metal corrosion inhibitor is in an amount of at least about 0.05% by weight (e.g., at least about 0.1% by weight, at least about 0.15% by weight, at least about 0.2% by weight, at least about 0.25% by weight, or at least about 0.3% by weight) and/or at most about 1% by weight (e.g., at most about 0.9% by weight, at most about 0.8% by weight, at most about 0.7% by weight, at most about 0.6% by weight, at most about 0.5% by weight, at most about 0.4% by weight, or at most about 0.3% by weight) of the etching compositions of this disclosure. Without wishing to be bound by theory, it is believed that including a metal corrosion inhibitor in the etching compositions of this disclosure can reduce corrosion or etching of metals (e.g., Co, Cu, or W) and/or high-k dielectric materials (e.g., HfOx) in a semiconductor substrate.

In some embodiments, the etching compositions of this disclosure can contain at least one (e.g., two, three, or four) organic solvent. Preferably the organic solvent is selected from the group consisting of water soluble alcohols, water soluble ketones, water soluble esters, and water soluble ethers (e.g., glycol diethers).

Classes of water soluble alcohols include, but are not limited to, alkane diols (including, but not limited to, alkylene glycols), glycols, alkoxyalcohols (including but not limited to glycol monoethers), saturated aliphatic monohydric alcohols, unsaturated non-aromatic monohydric alcohols, and low molecular weight alcohols (e.g., $C_4$-$C_8$ alcohols) containing a ring structure.

Examples of water soluble alkane diols includes, but are not limited to, 2-methyl-1,3-propanediol, 1,3-propanediol, 2,2-dimethyl-1,3-diol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, diethylene glycol, dipropylene glycol, triethylene glycol and tetraethylene glycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether (EGBE), diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited, to tetrahydrofurfuryl alcohol, furfuryl alcohol, and 1,3-cyclopentanediol.

Examples of water soluble ketones include, but are not limited to, acetone, cyclobutanone, cyclopentanone, diacetone alcohol, 2-butanone, 5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters (such as ethylene glycol monoacetate and diethyleneglycol monoacetate), and glycol monoether monoesters (such as propylene glycol monomethyl ether acetate, ethylene glycol monomethyl ether acetate, propylene glycol monoethyl ether acetate, and ethylene glycol monoethyl ether acetate).

In some embodiments, the at least one organic solvent is in an amount of at least about 1% by weight (e.g., at least about 2% by weight, at least about 3% by weight, at least about 4% by weight, at least about 5% by weight, at least about 6% by weight, at least about 7% by weight, at least about 8% by weight, at least about 9% by weight, or at least about 10% by weight) and/or at most about 30% by weight (e.g., at most about 25% by weight, at most about 20% by weight, at most about 15% by weight, at most about 14% by weight, at most about 13% by weight, at most about 12% by weight, at most about 11% by weight, at most about 10% by weight) of the etching compositions of this disclosure.

In some embodiments, the etching compositions of this disclosure can contain at least one (e.g., two, three, or four) amine compound. The amine compound can be a diamine, an alkanolamine, or a quaternary ammonium compound. In some embodiments, the amine compound can include 1, 2, 3, 4, 5, or 6 carbon atoms.

In some embodiments, the diamine can be a compound of formula (I): $H_2N-R_1-NH_2$ (I), in which $R_1$ is a linear or branched $C_2$-$C_6$ alkyl. Examples of diamines of formula (I) include ethylenediamine, 1,2-diaminopropane, and 1,3-diaminopropane.

In some embodiments, the alkanolamine can be a compound of formula (II): $HO-R_1-NH_2$ (II), in which $R_1$ is a linear or branched $C_2$-$C_6$ alkyl. An example of an alkanolamine of formula (II) is ethanolamine (also known as monoethanolamine or MEA).

In some embodiments, the quaternary ammonium compound can be a quaternary ammonium salt or quaternary ammonium hydroxide. In some embodiments, the quaternary ammonium compound can be a tetraalkylammonium compound (e.g., a salt or a hydroxide). In some embodiments, the quaternary ammonium compound can be a compound of formula (III): $[NR_1R_2R_3R_4]^+X^-$ (III), in which each of $R_1$, $R_2$, $R_3$, and $R_4$, independently, is a linear or branched $C_1$-$C_6$ alkyl and X is OH or halo (e.g., F, Cl, Br, or I). An example of a quaternary ammonium compound of formula (III) is tetramethylammonium fluoride.

In some embodiments, the at least one amine compound is in an amount of at least about 0.1% by weight (e.g., at least about 0.2% by weight, at least about 0.3% by weight, at least about 0.5% by weight, at least about 0.7% by weight, at least about 1% by weight, at least about 1% by weight, at least about 1.2% by weight, at least about 1.4% by weight, or at least about 1.5% by weight) and/or at most about 5% by weight (e.g., at most about 4.5% by weight, at most about 4% by weight, at most about 3.5% by weight, at most about 3% by weight, at most about 2.5% by weight, at most about 2% by weight, at most about 1.5% by weight, or at most about 1% by weight) of the etching compositions of this disclosure. Without wishing to be bound by theory, it is believed that including an amine compound in the etching compositions of this disclosure can increase TiSiN etching and/or reduce corrosion or etching of high-k dielectric materials (e.g., HfOx) in a semiconductor substrate.

The etching compositions of the present disclosure can further include water. Preferably, the water is de-ionized and ultra-pure, contains no organic contaminants and has a minimum resistivity of about 4 to about 17 mega Ohms. More preferably, the resistivity of the water is at least about 17 mega Ohms.

In some embodiments, the water is in an amount of at least about 35% by weight (e.g., at least about 45% by weight, at least about 50% by weight, at least about 55% by weight, at least about 60% by weight, at least about 65% by weight, at least about 68% by weight, or at least about 70% by weight) and/or at most about 98% by weight (e.g., at most about 95% by weight, at most about 90% by weight, at most about 85% by weight, at most about 80% by weight, at most about 75% by weight, or at most about 70% by weight) of the etching compositions of this disclosure.

In some embodiments, the etching compositions of this disclosure can optionally include at least one (e.g., two, three, or four) acid. The acid can be an organic acid or an inorganic acid. Suitable organic acids can include carboxylic acids or sulfonic acids, such as alkylsulfonic acids or arylsulfonic acids. Examples of suitable alkylsulfonic acids include methanesulfonic acid, trifluoromethanesulfonic acid (or triflic acid), and 2-hydroxyethanesulfonic acid (or isethionic acid). An example of a suitable arylsulfonic acid is p-toluenesulfonic acid. Suitable inorganic acid can include mineral acids, such as hydrogen halides (e.g., hydrochloric acid or hydrobromic acid).

In some embodiments, the at least one acid is in an amount of at least about 0.1% by weight (e.g., at least about 0.2% by weight, at least about 0.3% by weight, at least about 0.5% by weight, at least about 0.7% by weight, at least about 1% by weight, at least about 1% by weight, at least about 1.2% by weight, at least about 1.4% by weight, at least about 1.5% by weight, at least about 1.6% by weight, at least about 1.8% by weight, or at least about 2% by weight) and/or at most about 5% by weight (e.g., at most about 4.5% by weight, at most about 4% by weight, at most about 3.5% by weight, at most about 3% by weight, at most about 2.5% by weight, at most about 2% by weight, at most about 1.5% by weight, or at most about 1% by weight) of the etching compositions of this disclosure. Without wishing to be bound by theory, it is believed that including an acid in the etching compositions of this disclosure can adjust the pH of the compositions and reduce corrosion or etching of high-k dielectric materials (e.g., HfOx) in a semiconductor substrate.

In some embodiments, the etching compositions of this disclosure can have a pH of at least about 6.5 (e.g., at least about 7, at least about 7.5, at least about 7.8, or at least about 8) and/or at most about 9.5 (e.g., at most about 9, at most about 8.5, at most about 8.2, or at most about 8). Without wishing to be bound by theory, it is believed that an etching composition having a pH lower than 6.5 would significantly increase cobalt etch rate and reduce TiSiN etch rate, and an etching composition having a pH higher than 9.5 would result in increased decomposition of the oxidizing agent (e.g., hydrogen peroxide) and significantly increase corrosion to tungsten. In order to obtain the desired pH, the relative concentrations of the polyaminopolycarboxylic acid, the benzotriazole (or its derivative), the acid, and the amine compound in the etching compositions of this disclosure can be adjusted.

In some embodiments, the etching compositions of the present disclosure can contain additives such as, additional pH adjusting agents, additional corrosion inhibitors, surfactants, additional organic solvents, biocides, and defoaming agents as optional components.

Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Optional surfactants may be cationic, anionic, nonionic or amphoteric.

In some embodiments, the etching compositions of this disclosure can optionally exclude one or more of components, in any combination, if more than one. Such components that can be excluded from the etching compositions are selected from the group consisting of organic solvents, pH adjusting agents, polymers (e.g., cationic or anionic polymers, or polyethers such as poly(methyl vinyl ether)s), oxygen scavengers, quaternary ammonium compounds (e.g., salts or hydroxides), amines, alkali bases (such as alkali hydroxides), surfactants other than a defoamer, a defoamer, fluoride containing compounds, abrasives (e.g., cationic or anionic abrasives), silicates, hydroxycarboxylic acids (e.g., those containing more than two hydroxyl groups), monocarboxylic and polycarboxylic acids (e.g., those containing or lacking amino groups), silanes (e.g., alkoxysilanes), imines (e.g., amidines such as 1,8-diazabicyclo[5.4.0]-7-undecene (DBU) and 1,5-diazabicyclo[4.3.0]non-5-ene (DBN)), hydrazines, cyclic compounds (e.g., azoles (such as diazoles, triazoles, or tetrazoles), triazines, and cyclic compounds containing at least two rings such as substituted or unsubstituted naphthalenes, or substituted or unsubstituted biphenylethers), buffering agents, non-azole corrosion inhibitors, halide salts, and metal salts (e.g., metal halides).

In some embodiments, an advantage of the etching compositions described herein is that it can selectively etch TiSiN without substantially remove or etch high-k dielectric materials (e.g., HfOx).

The etching compositions of this disclosure can be prepared by simply mixing the components together, or can be prepared by blending two compositions in a kit. The first composition in the kit can be an aqueous solution of an oxidizing agent (e.g., hydrogen peroxide). The second composition in the kit can contain the remaining components of the etching compositions of this disclosure at predetermined ratios in a concentrated form such that the blending of the two compositions will yield a desired etching composition of this disclosure.

Alternatively, the etching compositions of this disclosure can be prepared by blending three compositions in a kit. In such embodiments, the first composition can include the oxidizing agent in the form of an aqueous concentrate, the second composition can include water only, and the third composition can include all of the remaining components of the etching compositions of this disclosure at predetermined ratios.

The present disclosure also features a method of etching a semiconductor substrate containing TiSiN features. The method can include contacting a semiconductor substrate containing TiSiN features with an etching composition of this disclosure to remove the TiSiN features. The method can further include rinsing the semiconductor substrate with a rinse solvent after the contacting step and/or drying the semiconductor substrate after the rinsing step. In some embodiments, the method does not substantially remove HfOx in the semiconductor substrate. For example, the method does not remove more than about 5% by weight (e.g., more than about 3% by weight or more than about 1% by weight) of HfOx in the semiconductor substrate. As another example, the film loss of a HfOx layer in the semiconductor substrate can be at most about 1 Å (e.g., at most about 0.5 Å or 0.1 Å) during use of the etching compositions described herein for a period of time (e.g., 2 minutes) to achieve a desired TiSiN etching effect.

In some embodiments, the etching method includes the steps of:
(A) providing a semiconductor substrate containing TiSiN features;
(B) contacting the semiconductor substrate with an etching composition described herein;
(C) rinsing the semiconductor substrate with one or more suitable rinse solvents; and
(D) optionally, drying the semiconductor substrate (e.g., by any suitable means that removes the rinse solvent and does not compromise the integrity of said semiconductor substrate).

In some embodiments, the etching method further includes forming a semiconductor device (e.g., an integrated circuit device such as a semiconductor chip) from the semiconductor substrate obtained by the method described above.

The semiconductor substrates containing TiSiN features to be etched in this method can contain organic and organometallic residues, and additionally, a range of metal oxides that may also be removed during the etching process.

Semiconductor substrates typically are constructed of silicon, silicon germanium, Group III-V compounds like GaAs, or any combination thereof. The semiconductor substrates can additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrate can also contain layers of interlayer dielectrics, silicon oxide, silicon nitride, silicon carbide, titanium oxide, and carbon doped silicon oxides.

The semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof. In some embodiments, the semiconductor substrate is immersed into the etching composition.

The etching compositions of the present disclosure can be effectively used up to a temperature of about 85° C. In some embodiments, the etching compositions can be used from about 20° C. to about 80° C. (e.g., from about 55° C. to about 65° C., or from about 60° C. to about 65° C.). The etch rate of TiSiN increases with temperature in this range, thus processes with higher temperature can be run for shorter times and processes with lower temperatures require longer etching times.

Etching times can vary over a wide range depending on the particular etching method, thickness and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes).

In some embodiments, etching times for a single wafer process can range from about 30 seconds to about 5 minutes (e.g., from about 30 seconds to about 4 minutes, from about 1 minute to about 3 minutes, or from about 1 minute to about 2 minutes).

To further promote the etching ability of the etching composition of the present disclosure, mechanical agitation means can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any suitable angle. Horizontal or vertical orientations are preferred.

In some embodiments, subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) can be employed. Examples of rinse solvents include, but are not limited to, dilute aqueous ammonium hydroxide, DI water, methanol, ethanol and isopropyl alcohol. In some embodiments, the rinse solvents are dilute aqueous ammonium hydroxide, DI water and isopropyl alcohol. The solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Marangoni drying, rotagoni drying, IPA drying or any combinations thereof. Drying times will be dependent on the specific method employed but are typically on the order of 15 seconds up to several minutes.

In some embodiments, the semiconductor substrate can subsequently be processed to form one or more circuits on the substrate or can be processed to form into a semiconductor chip by, for example, assembling (e.g., dicing and bonding) and packaging (e.g., chip sealing).

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a 1 inch stirring bar at 250 rpm unless otherwise noted.

General Procedure 1

Formulation Blending

Samples of etching compositions were prepared by adding, while stirring, to the calculated amount of the solvent the remaining components of the formulation. After a uniform solution was achieved, optional additives, if used, were added.

General Procedure 2

Materials and Methods

Blanket film etch rate measurements on films were carried out using commercially available unpatterned 300 mm diameter wafers that were diced into 0.5"×0.5" test coupons for evaluation. Primary blanket film materials used for testing include 1) TiSiN film containing 19 wt % Si having a thickness of about 52 Å deposited on a silicon substrate, 2) TiSiN film containing 23 wt % Si having a thickness of about 56 A deposited on a silicon substrate, and 3) hafnium oxide (HfOx) film of 20 Å thickness deposited on a silicon substrate.

The blanket film test coupons were measured for pre-treatment and post-treatment thickness to determine blanket film etch rates. For the TiSiN and HfOx films, the thicknesses were measured pre-treatment and post-treatment by Ellipsometry using a Woollam M-2000X.

General Procedure 3

Etching Evaluation with Beaker Test

All blanket film etch and patterned coupon etch tests were carried out in a 60° C. heated 600 mL glass beaker containing 200 g of a sample solution with continuous stirring at 250 rpm, with the Parafilm® cover in place at all times to minimize evaporative losses. All blanket or patterned test coupons having either a pattern or a blanket metal or dielectric film exposed on one side to the sample solution were diced by diamond scribe into 0.5"×0.5" square test coupon size for beaker scale testing. Each individual test coupon was held into position using a single 4" long, locking plastic tweezers clip. The test coupon, held on one edge by the locking tweezers clip, was suspended into the 600 mL glass beaker and immersed into the 200 g test solution while the solution was heated at 60° C. and stirred continuously at 250 rpm. Immediately after each sample coupon was placed into the heated and stirred solution, the top of the 600 mL glass beaker was covered and resealed with Parafilm®. The test coupons were held static in the stirred, heated solution until the treatment time (as described in General Procedures 3A) had elapsed. After the treatment time in the test solution had elapsed, the sample coupons were immediately removed from the 600 mL glass beaker and rinsed according to General Procedure 3A (blanket test coupons). After the final DI rinse step, all test coupons were subject to a filtered nitrogen gas blow off step using a hand held nitrogen gas blower which forcefully removed all traces of DI water to produce a final dry sample for test measurements.

General Procedure 3A (Blanket Test Coupons)

Immediately after a treatment time of 10 minutes according to General Procedure 3, the coupon was immersed in a 1000 mL volume of ultra-high purity deionized (DI) water with ~1 liter/min overflow rate at 20° C. for 15 seconds and then for an additional 15 seconds with mild agitation. The processing was completed according to General Procedure 3.

Example 1

Formulation Examples 1-10 (FE-1 to FE-10) were prepared according to General Procedure 1, and evaluated according to General Procedures 2 and 3. The TiSiN and HfOx films were etched at 60° C. for 2 minutes. The formulations are summarized in Table 1 and the test results are summarized in Table 2.

TABLE 1

| Ex. | $H_2O_2$ | DTPA | EGBE | 5-MBTA | Amine | Acid | Water | pH |
|---|---|---|---|---|---|---|---|---|
| FE-1 | 17.5% | 0.25% | 10.11% | 0.22% | EDA 0.15% | None | 71.79% | 7.9 |
| FE-2 | 17.5% | 0.23% | 9.2% | 0.2% | MEA 1.54% | MSA 1.61% | 69.72% | 8 |
| FE-3 | 17.5% | 0.25% | 10.07% | 0.22% | 1,3-DAP 0.26% | None | 71.7% | 8 |
| FE-4 | 17.5% | 0.25% | 10.05% | 0.22% | 1,2-DAP 0.34% | None | 71.64% | 8 |
| FE-5 | 17.5% | 0.23% | 9.23% | None | MEA 1.54% | MSA 1.51% | 69.98% | 8 |
| FE-6 | 17.5% | 0.23% | 7.9% | None | MEA 1.3% | p-TSA 2.39% | 70.68% | 8 |
| FE-7 | 17.5% | 0.23% | 9.2% | None | MEA 1.5% | TA 2.2% | 69.37% | 8 |
| FE-8 | 17.5% | 0.23% | 9.1% | None | MEA 1.5% | IA 1.9% | 69.77% | 8 |
| FE-9 | 17.5% | 0.23% | 9.4% | None | MEA 1.6% | HCl 0.5% | 70.77% | 8 |
| FE-10 | 17.5% | 0.23% | 10% | 0.22% | TMAF 1.87% | None | 70.18% | 7.5 |

DTPA = Diethylenetriaminepentaacetic acid
EGBE = Ethylene glycol mono n-butyl ether
MEA = Monoethanolamine
1,2-DAP = 1,2-Diaminopropane
MSA = Methanesulfonic acid
TA = Triflic acid
5-MBTA = 5-Methylbenzotriazole
EDA = Ethylenediamine
1,3-DAP = 1,3-Diaminopropane
TMAF = Tetramethylammonium fluoride
p-TSA = p-Toluenesulfonic acid
IA = Isethionic acid

TABLE 2

| Ex. | TiSiN (Si19%) Film Thickness Loss (Å) | TiSiN (Si23%) Film Thickness Loss (Å) | HfOx Film Thickness Loss (Å) |
|---|---|---|---|
| FE-1 | 50 | — | <0.1 |
| FE-2 | 51 | 46 | <0.1 |
| FE-3 | >51 | 56 | <0.1 |
| FE-4 | 46 | 43 | <0.1 |
| FE-5 | 50 | 46 | <0.1 |
| FE-6 | 50 | 41 | <0.1 |
| FE-7 | 50 | 30 | <0.1 |
| FE-8 | 51 | 42 | <0.1 |
| FE-9 | 52 | 43 | <0.1 |
| FE-10 | 45 | 39 | <0.1 |

Comparative Formulation Examples 1-15 (CFE-1 to CFE-15) were prepared according to General Procedure 1, and evaluated according to General Procedures 2 and 3. The TiSiN and HfOx films were etched at 60° C. for 2 minutes. The formulations are summarized in Table 3 and the test results are summarized in Table 4.

TABLE 3

| Ex. | HA | $H_2O_2$ | DTPA | EGBE | 5-MBTA | DBU | Acid | Additive | Water | pH |
|---|---|---|---|---|---|---|---|---|---|---|
| CFE-1 | None | 17.5% | 0.25% | 10% | 0.22% | 0.56% | None | None | 71.47% | 7.5 |
| CFE-2 | None | 17.5% | 0.23% | 9.3% | None | 3.3% | HF 0.39% | None | 69.28% | 7.5 |
| CFE-3 | 0.4% | 17.5% | 0.23% | 9.8% | 0.22% | 0.5% | None | None | 71.35% | 7.8 |
| CFE-4 | 1.5% | 17.5% | 0.23% | 9.3% | 0.2% | 0.5% | None | None | 70.77% | 7.8 |
| CFE-5 | None | 17.5% | 0.23% | 9.2% | 0.2% | 2.2% | TFBA 0.8% | None | 69.87% | 7.8 |

TABLE 3-continued

| Ex. | HA | H$_2$O$_2$ | DTPA | EGBE | 5-MBTA | DBU | Acid | Additive | Water | pH |
|---|---|---|---|---|---|---|---|---|---|---|
| CFE-6 | None | 17.5% | 0.25% | 10% | 0.22% | 0.5% | None | NBDEA 0.4% | 71.13% | 7.7 |
| CFE-7 | None | 17.5% | 0.25% | 10.1% | 0.22% | 0.2% | None | NAPDEA 0.4% | 71.33% | 7.6 |
| CFE-8 | None | 17.5% | 0.25% | 10.1% | 0.22% | 0.3% | None | NMG 0.4% | 71.23% | 7.6 |
| CFE-9 | None | 17.5% | 0.25% | 10% | 0.22% | 0.5% | None | BHEAP 0.4% | 71.13% | 7.6 |
| CFE-10 | None | 17.5% | 0.23% | 9.9% | 0.21% | 1.1% | CA 0.4% | None | 70.66% | 7.5 |
| CFE-11 | None | 17.5% | 0.23% | 10% | 0.21% | 0.7% | SA 0.4% | None | 70.96% | 7.5 |
| CFE-12 | None | 17.5% | 0.23% | 9.7% | 0.21% | 1.6% | OA 0.4% | None | 70.36% | 7.5 |
| CFE-13 | None | 17.5% | 0.7% | 9.8% | 0.22% | 1.2% | None | None | 70.58% | 8 |
| CFE-14 | None | 17.5% | 0.23% | 10% | 0.22% | 0.7% | None | Catechol 0.4% | 70.96% | 8 |
| CFE-15 | None | 17.5% | 0.23% | 9.9% | 0.21% | 1.1% | GA 0.4% | None | 70.66% | 7.5 |

HA = Hydroxyamine
TFBA = Tetrafluoroboric acid
NAPDEA = N-(3-aminopropyl)diethanolamine
BHEAP = 1-[Bis(2-hydroxyethyl)amino]-2-propanol
SA = Salicylic acid
GA = Gallic acid
DBU = 1,8-diazabicyclo[5.4.0]-7-undecene
NBDEA = N-butyldiethanolamine
NMG = N-methylglucamine
CA = Citric acid
OA = Oxalic acid

TABLE 4

| Ex. | TiSiN (Si19%) Film Thickness Loss (Å) | TiSiN (Si23%) Film Thickness Loss (Å) | HfOx Film Thickness Loss (Å) |
|---|---|---|---|
| CFE-1 | 26 | 15 | <0.1 |
| CFE-2 | 45.3 | 27 | 0.6 |
| CFE-3 | 32.2 | 15 | <0.1 |
| CFE-4 | 33.9 | 13.9 | <0.1 |
| CFE-5 | 31.6 | 14.7 | <0.1 |
| CFE-6 | 31 | 16 | <0.1 |
| CFE-7 | 31 | 16 | <0.1 |
| CFE-8 | 33 | 17 | <0.1 |
| CFE-9 | 33 | 16 | <0.1 |
| CFE-10 | 33 | — | <0.1 |
| CFE-11 | 34 | — | <0.1 |
| CFE-12 | 34 | — | <0.1 |
| CFE-13 | 34.7 | — | <0.1 |
| CFE-14 | 33.8 | — | <0.1 |
| CFE-15 | 33.7 | — | 0.2 |

As shown in Tables 2 and 4, formulations FE-1 to FE-10 exhibited improved TiSiN etching and reduced HfOx etching compared to comparative formulations CFE-1 to CFE-15.

While the invention has been described in detail with reference to certain embodiments thereof, it will be understood that modifications and variations are within the spirit and scope of that which is described and claimed.

What is claimed is:

1. An etching composition, comprising:
   1) at least one oxidizing agent in an amount of from about 0.1% to about 30% by weight of the composition;
   2) at least one chelating agent in an amount of from about 0.01% to about 1% by weight of the composition, the at least one chelating agent comprises polyaminopolycarboxylic acid;
   3) at least one organic solvent in an amount of from about 1% to about 30% by weight of the composition, the at least one organic solvent comprising a solvent selected from the group consisting of water soluble alcohols, water soluble ketones, water soluble esters, and water soluble ethers;
   4) at least one amine compound comprising a diamine or a quaternary ammonium compound, the at least one amine compound comprising 1 to 6 carbon atoms and being in an amount of from about 0.1% to about 5% by weight of the composition; and
   5) water;
   wherein the composition has a pH from about 6.5 to about 9.5.

2. The composition of claim 1, wherein the composition has a pH from about 7 to about 9.5.

3. The composition of claim 1, wherein the at least one oxidizing agent comprises hydrogen peroxide.

4. The composition of claim 1, wherein the at least one oxidizing agent is in an amount of from about 1% to about 18% by weight of the composition.

5. The composition of claim 1, wherein the at least one chelating agent is in an amount of from about 0.1% to about 0.5% by weight of the composition.

6. The composition of claim 1, wherein the at least one organic solvent comprises a solvent selected from the group consisting of water soluble alcohols and water soluble ethers.

7. The composition of claim 1, wherein the composition comprises from about 5% to about 25% by weight of the at least one organic solvent.

8. The composition of claim 1, wherein the at least one amine compound comprises ethylenediamine, 1,2-diaminopropane, 1,3-diaminopropane, or tetramethylammonium fluoride.

9. The composition of claim 1, wherein the at least one amine compound is in an amount of from about 1% to about 5% by weight of the composition.

10. The composition of claim 1, wherein the water is in an amount of from about 35% to about 98% by weight of the composition.

11. The composition of claim 1, wherein the composition is free of a polymer, an imine, a hydrazine, or an amidine.

12. The composition of claim 1, wherein the polyaminopolycarboxylic acid is selected from the group consisting of mono- or polyalkylene polyamine polycarboxylic acids, polyaminoalkane polycarboxylic acids, polyaminoalkanol polycarboxylic acids, and hydroxyalkylether polyamine polycarboxylic acids.

13. The composition of claim 12, wherein the polyaminopolycarboxylic acid is selected from the group consisting of butylenediaminetetraacetic acid, diethylenetriaminepentaacetic acid, ethylenediaminetetrapropionic acid, triethylenetetraminehexaacetic acid, 1,3-diamino-2-hydroxypropane-N,N,N',N'-tetraacetic acid, propylenediaminetetraacetic acid, ethylenediaminetetraacetic acid, trans-1,2-diaminocyclohexane tetraacetic acid, ethylendiamine diacetic acid, ethylendiamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, iminodiacetic acid; 1,4,7,10-tetraazacyclododecane-tetraacetic acid, diaminopropanol tetraacetic acid, and (hydroxyethyl)ethylenediaminetriacetic acid.

14. The composition of claim 1, further comprising at least one acid.

15. The composition of claim 14, wherein the at least one acid comprises an inorganic acid or a sulfonic acid.

16. The composition of claim 14, wherein the at least one acid is in an amount of from about 0.1% to about 5% by weight of the composition.

17. The composition of claim 1, further comprising at least one metal corrosion inhibitor.

18. The composition of claim 17, wherein the at least one metal corrosion inhibitor is in an amount of from about 0.1% to about 0.5% by weight of the composition.

19. The composition of claim 17, wherein the at least one metal corrosion inhibitor comprises a substituted or unsubstituted benzotriazole.

20. The composition of claim 19, wherein the at least one metal corrosion inhibitor comprises a benzotriazole optionally substituted by at least one substituent selected from the group consisting of alkyl groups, aryl groups, halogen groups, amino groups, nitro groups, alkoxy groups, and hydroxyl groups.

21. The composition of claim 19, wherein the substituted or unsubstituted benzotriazole is selected from the group consisting of benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-i sopropylbenzotriazole, 5-isopropylbenzotriazole, 4-n-butylbenzotriazole, 5-n-butylbenzotriazole, 4-i sobutylbenzotriazole, 5-i sobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'- dimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

22. A method, comprising contacting a semiconductor substrate containing TiSiN features with the etching composition of claim 1 to remove the TiSiN features.

23. The method of claim 22, wherein the method does not substantially remove HfOx in the semiconductor substrate.

24. The method of claim 22, further comprising rinsing the semiconductor substrate with a rinse solvent after the contacting step.

25. The method of claim 24, further comprising drying the semiconductor substrate after the rinsing step.

26. An etching composition, comprising:
1) at least one oxidizing agent in an amount of from about 0.1% to about 30% by weight of the composition;
2) at least one chelating agent in an amount of from about 0.01% to about 1% by weight of the composition;
3) at least one organic solvent in an amount of from about 1% to about 30% by weight of the composition, the at least one organic solvent comprising a solvent selected from the group consisting of water soluble alcohols, water soluble ketones, water soluble esters, and water soluble ethers;
4) at least one amine compound comprising an alkanolamine, wherein the alkanolamine is in an amount of from about 0.5% to about 5% by weight of the composition and is of formula (II):

HO—R$_1$—NH$_2$(II), in which R$_1$ is a linear or branched C$_2$-C$_6$ alkyl; and
5) water;
wherein the composition has a pH from about 6.5 to about 9.5.

27. The composition of claim 26, wherein the alkanolamine is ethanolamine.

* * * * *

UNITED STATES PATENT AND TRADEMARK OFFICE
CERTIFICATE OF CORRECTION

| | |
|---|---|
| PATENT NO. | : 11,499,099 B2 |
| APPLICATION NO. | : 17/009857 |
| DATED | : November 15, 2022 |
| INVENTOR(S) | : Kazutaka Takahashi, Tomonori Takahashi and William A. Wojtczak |

It is certified that error appears in the above-identified patent and that said Letters Patent is hereby corrected as shown below:

In the Specification

Column 3
Line 52, delete "ethylendiamine diacetic acid" and insert -- ethylenediamine diacetic acid --
Lines 52-53, delete "ethylendiamine diproponic acid" and insert -- ethylenediamine diproponic acid --

In the Claims

Column 15
Line 5, in Claim 13, delete "ethylendiamine diacetic acid" and insert -- ethylenediamine diacetic acid --
Line 5, in Claim 13, delete "ethylendiamine diproponic" and insert -- ethylenediamine diproponic --

Column 16
Line 1, in Claim 21, delete "4-i sopropylbenzotriazole," and insert -- 4-isopropylbenzotriazole, --
Lines 2-3, in Claim 21, delete "4-i sobutylbenzotriazole, 5-i sobutylbenzotriazole," and insert -- 4-isobutylbenzotriazole, 5-isobutylbenzotriazole, --
Line 8, in Claim 21, delete "5-(1',1'- dimethylpropyl)" and insert -- 5-(1',1'-dimethylpropyl) --
Line 36, in Claim 26, delete "HO—$R_1$—$NH_2$(II)," and insert -- HO—$R_1$—$NH_2$ (II), --

Signed and Sealed this
Tenth Day of January, 2023

Katherine Kelly Vidal
*Director of the United States Patent and Trademark Office*